(12) United States Patent
Labbe et al.

(10) Patent No.: US 11,722,108 B2
(45) Date of Patent: Aug. 8, 2023

(54) FULLY-DIFFERENTIAL PREAMPLIFIER

(71) Applicant: Pacesetter, Inc., Sylmar, CA (US)

(72) Inventors: Eric C. Labbe, Sunnyvale, CA (US);
Benjamin T. Persson, Saratoga, CA (US)

(73) Assignee: Pacesetter, Inc., Sylmar, CA (US)

( * ) Notice: Subject to any disclaimer, the term of this patent is extended or adjusted under 35 U.S.C. 154(b) by 12 days.

(21) Appl. No.: 17/538,837

(22) Filed: Nov. 30, 2021

(65) Prior Publication Data

US 2023/0170863 A1 Jun. 1, 2023

(51) Int. Cl.
*H03F 3/45* (2006.01)
*H03K 3/356* (2006.01)

(52) U.S. Cl.
CPC ..... *H03F 3/45179* (2013.01); *H03F 3/45632* (2013.01); *H03F 2203/45022* (2013.01); *H03F 2203/45026* (2013.01); *H03F 2203/45072* (2013.01); *H03K 3/35613* (2013.01)

(58) Field of Classification Search
CPC ............ H03F 3/45179; H03F 3/45632; H03F 2203/45022; H03F 2203/45026; H03F 2203/45072; H03F 3/45475; H03F 1/303; H03F 3/005; H03F 1/02; H03F 3/45183; H03F 3/45192; H03F 3/45089; H03F 3/72; H03F 1/0277; H03F 3/45; H03K 3/35613; H03G 1/0088
USPC .............................................. 330/9, 51, 253
See application file for complete search history.

(56) References Cited

U.S. PATENT DOCUMENTS

| 5,953,276 A | 9/1999 | Baker |
| 6,184,721 B1 | 2/2001 | Krymski |
| 6,985,036 B2 * | 1/2006 | Bhattacharjee ..... H03F 3/45183 330/253 |

(Continued)

FOREIGN PATENT DOCUMENTS

EP 3747505 A1 3/2021

OTHER PUBLICATIONS

Karki, James, "Fully-Differential Amplifiers," Texas Instruments, Application Report, ALOA054E, Sep. 2016, 28 pages.

(Continued)

*Primary Examiner* — Khanh V Nguyen
(74) *Attorney, Agent, or Firm* — Vierra Magen Marcus LLP

(57) ABSTRACT

Described herein is a fully-differential preamplifier comprising an input differential pair, an output current load, and a current source. The current source is coupled between the input differential pair and a low voltage rail and configured to control whether the fully-differential preamplifier is operating in a first mode or a second mode, wherein the preamplifier draws more current when operating in the second mode compared to when operating in the first mode. The input differential pair is coupled between the output current load and the current source. The output current load is coupled between a high voltage rail and the input differential pair. The input differential pair comprise positive and negative inputs of the fully-differential preamplifier. Nodes where the input differential pair and the output current load are coupled to one another comprise positive and negative outputs of the fully-differential preamplifier.

20 Claims, 5 Drawing Sheets

(56) References Cited

U.S. PATENT DOCUMENTS

| | | | |
|---|---|---|---|
| 8,878,609 B2* | 11/2014 | Jung | H03F 3/45071 |
| | | | 330/253 |
| 9,148,098 B2* | 9/2015 | Kim | H03F 3/45188 |
| 9,561,382 B2 | 2/2017 | Persson et al. | |
| 9,564,863 B1* | 2/2017 | Giridharan | H03G 1/0029 |
| 10,243,664 B2* | 3/2019 | Nagatani | H03G 3/001 |
| 10,722,724 B2 | 7/2020 | Carroll | |
| 2007/0176638 A1* | 8/2007 | Park | H03K 19/018585 |
| | | | 326/83 |
| 2016/0164479 A1* | 6/2016 | Eom | H03F 3/45183 |
| | | | 330/253 |
| 2020/0403717 A1 | 12/2020 | Fishler et al. | |
| 2021/0104986 A1 | 4/2021 | Chang et al. | |

OTHER PUBLICATIONS

"Comparators," Chapter 10, Dec. 2012, 30 pages.
Wikipedia, "Buffer amplifier," XP055823985, [https://en.wikipedia.org.wiki/Buffer_amplifier] Aug. 17, 2017, 6 pages.
Extended European Search Report dated Oct. 24, 2022, European Patent Application No. 22170077.6.
Response to Extended European Search Report dated Jun. 5, 2023, European Patent Application No. 22170077.6.

* cited by examiner

FULLY-DIFFERENTIAL PREAMPLIFIER

RELATED APPLICATION

This application is related to commonly invented U.S. patent application Ser. No. 17/538,827, titled FULLY-DIFFERENTIAL RECEIVER FOR RECEIVING CONDUCTED COMMUNICATION SIGNALS, filed the same date as the present application, and is incorporated herein by reference.

FIELD

Embodiments of the present technology relate to a fully-differential receiver for use in an implantable medical device (IMD), and an IMD that includes a fully-differential receiver. Other embodiments of the present technology relate to a fully-differential preamplifier can be included in a fully-differential receiver. Such embodiments can be used to receive and/or amplify conducted communication signals.

BACKGROUND

Where a patient has multiple (i.e., two or more) implantable medical devices (IMDs), it is often beneficial for the IMDs to be able to communicate with one another. For example, where a patient has a leadless pacemaker implanted in or on an atrial cardiac chamber and another leadless pacemaker implanted in or on ventricular cardiac chamber, it is beneficial for the leadless pacemakers to communicate with one another to provide for dual-chamber synchronized pacing.

To enable dual-chamber synchronization between atrial and ventricular leadless pacemakers, an 'implant to implant' or 'i2i' communication scheme may be used. With an i2i communication scheme, low voltage pulses are transmitted by a first IMD (e.g., a first leadless pacemaker, operating as a transmitting device) across its electrodes and are received by a second IMD (e.g., a second leadless pacemaker, operating as a receiving device) across its own electrodes. The received signal, which is an attenuated version of the transmitted signal, is received as a voltage pulse across two electrodes of the second IMD that are coupled to a receiver thereof.

The above described 'i2i' communication scheme can also be referred to as a conducted communication scheme (or equivalently, a conductive communication scheme), and the above described signal that is transmitted from the first IMD to the second IMD can also be referred to as a conducted communication signal (or equivalently, a conductive communication signal).

SUMMARY

Certain embodiments of the present technology are directed to a fully-differential receiver having a differential pair of inputs and a differential pair of outputs, wherein the fully-differential receiver is for use in an implantable medical device (IMD) and configured to receive conducted communication signals that are transmitted by another IMD or an external device.

In accordance with certain embodiments, the fully-differential receiver comprises a fully-differential preamplifier, a fully-differential buffer, a first comparator, a second comparator, and an AC coupling network. The fully-differential preamplifier includes a differential pair of inputs and a differential pair of outputs. The fully-differential buffer includes a differential pair of inputs and a differential pair of outputs, wherein the differential pair of inputs of the fully-differential buffer are coupled to the differential pair of outputs of the preamplifier. The first comparator includes a differential pair of inputs and a first output. The second comparator includes a differential pair of inputs and a second output, wherein the differential pair of inputs of the second comparator are coupled to the differential pair of inputs of the first comparator such that the differential pair of inputs of the first and second comparators are coupled to one another. The AC coupling network is coupled between the differential outputs of the fully-differential buffer and the coupled together differential pair of inputs of the first and second comparators. The differential pair of inputs of the fully-differential receiver comprise the differential pair of inputs of the fully-differential preamplifier. The differential pair of outputs of the fully-differential receiver comprise the first output of the first comparator and the second output of the second comparator.

In accordance with certain embodiments, the fully-differential receiver is configured to operate in a first mode and a second mode. When operating in the first mode, the fully-differential receiver draws a first amount of current and monitors for a wakeup signal within a first frequency range. When operating in the second mode, the fully-differential receiver draws a second amount of current that is higher than the first amount of current, and is configured to receive one or more message content pulses within a second frequency range that is higher than the first frequency range.

In accordance with certain embodiments, the fully-differential receiver is configured to operate in the first mode when the fully-differential preamplifier, the fully-differential buffer, the first comparator, and the second comparator are provided with respective first biasing currents. The fully-differential receiver is configured to operate in the second mode when the fully-differential preamplifier, the fully-differential buffer, the first comparator, and the second comparator are provided with respective second biasing currents that are greater than the respective first biasing currents.

In accordance with certain embodiments, the differential pair of inputs of each of the first and second comparators include a respective non-inverting (+) input and a respective inverting (−) input. The first comparator is configured to produce an output pulse at the first output when a voltage potential difference between the non-inverting (+) input and the inverting (−) input of the first comparator exceeds a first offset and is positive relative to a common mode voltage of the fully-differential receiver. The second comparator is configured to produce an output pulse at the second output when a voltage potential difference between the non-inverting (+) input and the inverting (−) input of the second comparator exceeds a second offset and is negative relative to the common mode voltage of the fully-differential receiver.

In accordance with certain embodiments, the pair of inputs of the fully-differential receiver are coupled to a pair of electrodes of the IMD, wherein the pair of electrodes are used to sense conducted communication signals that are transmitted by another IMD or an external device.

In accordance with certain embodiments, the differential pair of outputs of the fully-differential buffer include a non-inverting (+) output and an inverting (−) output, and the differential pair of inputs of each of the first and second comparators include a respective non-inverting (+) input and a respective inverting (−) input. The non-inverting (+) input of the first comparator is coupled to the inverting (−) input of the second comparator. The inverting (−) input of the first comparator is coupled to the non-inverting (+) input of the second comparator.

In accordance with certain embodiments, the AC coupling network is configured to remove any DC offset that may be caused by the fully-differential preamplifier and the fully-differential buffer. An output DC biasing point of the AC coupling network is a common mode voltage (VCM) at the vcm node of the fully-differential receiver. In accordance with certain embodiments, the AC coupling network comprises first and second capacitors, and first and second resistors. The first capacitor is coupled between the non-inverting (+) output of the fully-differential buffer and the non-inverting (+) input of the first comparator, and between the non-inverting (+) output of the fully-differential buffer and the inverting (−) input of the second comparator. The second capacitor is coupled between the inverting (−) output of the fully-differential buffer and the inverting (−) input of the first comparator, and between the inverting (−) output of the fully-differential buffer and the non-inverting (+) input of the second comparator. The first resistor is coupled between a common mode voltage (vcm) node and the non-inverting (+) input of the first comparator, and between the common mode voltage (vcm) node and the inverting (−) input of the second comparator. The second resistor is coupled between the common mode voltage (vcm) node and the inverting (−) input of the first comparator, and between the common mode voltage (vcm) node and the non-inverting (+) input of the second comparator.

In accordance with certain embodiments, the differential pair of inputs of the fully-differential preamplifier include a non-inverting (+) input and an inverting (−) input. A first high pass filter is coupled to the non-inverting (+) input of the fully-differential preamplifier. A second high pass filter is coupled to the inverting (−) input of the fully-differential preamplifier. The first and second high pass filters are configured to filter out one or more signals indicative of cardiac electrical activity.

In accordance with certain embodiments, the differential pair of inputs of the fully-differential preamplifier include a non-inverting (+) input and an inverting (−) input. The fully-differential preamplifier comprises a pair of switches that when selectively closed cause there to be a zero voltage potential difference between the non-inverting (+) input and the inverting (−) input of the fully-differential preamplifier, and thus, cause there to be the zero voltage potential difference between the pair of inputs of the fully-differential receiver.

In accordance with certain embodiments, the fully-differential receiver is configured to operate in the both a first mode and a second mode, as noted above. The fully-differential preamplifier comprises switches that are selectively closed for a period of time to reset the fully-differential receiver whenever there is a change from the first mode to the second mode, as well as whenever there is a change from the second mode to the first mode.

Certain embodiments of the present technology are directed to an implantable medical device (IMD) that is configured to communicate with at least one of another IMD or an external device using conducted communication signals, wherein IMD comprises at least two electrodes, a fully-differential receiver, a logic detector, a controller, and a battery. The fully-differential receiver has a pair of inputs and a pair of outputs. The pair of inputs of the fully-differential receiver are coupled to a pair of the at least two electrodes. The logic detector has a pair of inputs and an output. The pair of inputs of the logic detector are coupled to the pair of outputs of the fully-differential receiver. The controller, which includes an input coupled to the output of the logic detector, is configured to decode pulses received from the logic detector. The battery is configured to power components of the IMD, including the fully-differential receiver, the logic detector, and the controller.

In accordance with certain embodiments, the fully-differential receiver of the IMD is configured to operate in a first mode and a second mode. When operating in the first mode, the fully-differential receiver draws a first amount of current from the battery and monitors for a wakeup signal within a first frequency range. When operating in the second mode, the fully-differential receiver draws a second amount of current from the battery that is higher than the first amount of current, and is configured to received one or more message content pulses within a second frequency range that is higher than the first frequency range.

In accordance with certain embodiments, the fully-differential receiver of the IMD comprises a fully-differential preamplifier, a fully-differential buffer, first and second comparators, and an AC coupling network. The fully-differential preamplifier includes a differential pair of inputs and a differential pair of outputs. The fully-differential buffer includes a differential pair of inputs and a differential pair of outputs, wherein the differential pair of inputs of the fully-differential buffer are coupled to the differential pair of outputs of the preamplifier. The first comparator includes a differential pair of inputs and a first output. The second comparator includes a differential pair of inputs and a second output, wherein the differential pair of inputs of the second comparator are coupled to the differential pair of inputs of the first comparator such that the differential pair of inputs of the first and second comparators are coupled to one another. The AC coupling network is coupled between the differential outputs of the fully-differential buffer and the coupled together differential pair of inputs of the first and second comparators. The differential pair of inputs of the fully-differential receiver comprise the differential pair of inputs of the fully-differential preamplifier. The differential pair of outputs of the fully-differential receiver comprise the first output of the first comparator and the second output of the second comparator.

In accordance with certain embodiments, the fully-differential receiver of the IMD is configured to operate in a first mode when the fully-differential preamplifier, the fully-differential buffer, the first comparator, and the second comparator are provided with respective first biasing currents. The fully-differential receiver of the IMD is configured to operate in a second mode when the fully-differential preamplifier, the fully-differential buffer, the first comparator, and the second comparator are provided with respective second biasing currents that are greater than the respective first biasing currents.

Certain embodiments of the present technology are directed to methods for use with a fully-differential receiver of an IMD, wherein the fully-differential receiver is powered by a battery of the IMD. Such a method can include operating the fully-differential receiver in accordance with a first mode, during which a wakeup signal is monitored for within a first frequency range. The method also includes, in response to detecting the wakeup signal while the fully-differential receiver is operating in the first mode, changing from operating the fully-differential receiver in accordance with the first mode to operating the fully-differential receiver in accordance with a second mode, during which one or more message content pulses are received within a second frequency range. The method further includes, changing from operating the fully-differential receiver in accordance with the second mode back to operating the fully-differential receiver in accordance with the first mode. In accordance with certain embodiments, the second frequency range is higher than the first frequency range, and the second mode drains more current and thereby more power from the battery compared to the first mode. In accordance with certain embodiments, the changing from operating the fully-differential receiver in accordance with the second mode back to operating the fully-differential receiver in accordance with the first mode occurs at an end of a message content window.

A fully-differential preamplifier, according to an embodiment of the present technology, has a differential pair of inputs including a positive input (INP) and a negative input (INM), and a differential pair of outputs including a positive output (OUTP) and a negative output (OUTM). In accordance with certain embodiments, the fully-differential preamplifier comprises first and second N-channel metal-oxide-semiconductor field-effect transistors (MOSFETs) (Mn1 and Mn2), and first and second P-channel MOSFETs (Mp1 and Mp2), each of which includes a gate, a drain, and a source. The sources of first and second N-channel MOSFETs (Mn1 and Mn2) connected to one another. The sources of the first and second P-channel MOSFETs (Mp1 and Mp2) connected to one another and to a high voltage rail (VPLUS). The fully-differential preamplifier also comprises a current source connected between the connected together sources of the first and second N-channel MOSFETs (Mn1 and Mn2) and a low voltage rail. The gate of the first N-channel MOSFET (Mn1) comprising the positive input (INP) of the fully-differential preamplifier. The gate of the second N-channel MOSFET (Mn2) comprising the negative input (INM) of the fully-differential preamplifier. The drains of the first N-channel MOSFET (Mn1) and the first P-channel MOSFET (Mp1) are connected to one another and comprise the negative output (OUTM) of the fully-differential preamplifier. The drains of the second N-channel MOSFET (Mn2) and the second P-channel MOSFET (Mp2) are connected to one another and comprise the positive output (OUTP) of the fully-differential preamplifier.

In accordance with certain embodiments, the fully-differential preamplifier also comprises: a first resistor and a first switch connected in parallel with one another between the gate and the drain of the first N-channel MOSFET (Mn1); a second resistor and a second switch connected in parallel with one another between the gate and the drain of the second N-channel MOSFET (Mn2); a third resistor and a third switch connected in parallel with one another between the gate and the drain of the first P-channel MOSFET (Mp1); and a fourth resistor and a fourth switch connected in parallel with one another between the gate and the drain of the second P-channel MOSFET (Mp2). The first, second, third and fourth switches are configured to reset an operating voltage of the fully-differential preamplifier when the first, second, third, and fourth switches are simultaneously closed.

In accordance with certain embodiments, the fully-differential preamplifier further comprises: a first capacitor coupled between the gate and the source of the first P-channel MOSFET (Mp1); and a second capacitor coupled between the gate and the source of the second P-channel MOSFET (Mp2). The first and second capacitors are configured to maintain voltages at the gates of the first and second P-channel MOSFETs (Mp1 and Mp2) so that the first and second P-channel MOSFETs (Mp1 and Mp2) act as current sources and increase an impedance of the fully-differential preamplifier, compared to if the first and second capacitors were not present.

In accordance with certain embodiments, the differential pair of inputs of fully-differential preamplifier, which include the positive input (INP) and the negative input (INM), are configured to be coupled to a pair of electrodes (E1 and E2) of an implantable medical device (IMD). A first high pass filter (HPF) is coupled between a first one of the electrodes and the positive input (INP). A second high pass filter (HPF) is coupled between a second one of the electrodes and the positive input (INP). The first and second HPFs are configured to filter out one or more signals indicative of cardiac electrical activity that may be sensed by the pair of electrodes. In accordance with certain embodiments, the first HPF comprises a third capacitor and a fifth resistor, the third capacitor including a first terminal and a second terminal, the first terminal of the third capacitor coupled to the first one of the electrodes, and the fifth resistor coupled between the second terminal of the third capacitor and the low voltage rail. The second HPF comprises a fourth capacitor and a sixth resistor, the fourth capacitor including a first terminal and a second terminal, the first terminal of the fourth capacitor coupled to the second one of the electrodes, and the sixth resistor coupled between the second terminal of the fourth capacitor and the low voltage rail.

In accordance with certain embodiments, the fully-differential preamplifier further comprises a fifth switch connected in parallel with the fifth resistor between the second terminal of the third capacitor and the low voltage rail, and a sixth switch connected in parallel with the sixth resistor between the second terminal of the fourth capacitor and the low voltage rail. The fifth and sixth switches are configured to force a zero voltage differential between the positive input (INP) and the negative input (INM), when the third and fourth switches are simultaneously closed.

In accordance with certain embodiments, the fully-differential preamplifier is configured for inclusion within a fully-differential receiver. In such an embodiments, the fifth and sixth switches when closed are configured to blank the fully-differential receiver.

In accordance with certain embodiments, the fully-differential preamplifier further comprises a fifth capacitor coupled between the second terminal of the third capacitor and the negative input (INM), and a sixth capacitor coupled between the second terminal of the fourth capacitor and the negative input (INM), wherein the fifth and sixth capacitors comprise direct current (DC) blocking capacitors.

In accordance with certain embodiments, the current source is configured to change operation of the fully-differential preamplifier from a low current mode to a higher current mode in response to a mode control signal received from a controller.

In accordance with certain embodiments, the fully-differential preamplifier includes a pair of blanking switches that are configured to force a zero voltage differential between the positive and negative inputs (INP and INM), in response to the blanking switches being simultaneously closed. Further, a voltage differential between the positive and negative outputs (OUTP and OUTM) is substantially zero while the pair of blanking switches are both closed.

In accordance with certain embodiments, a fully-differential preamplifier comprises an input differential pair, an output current load, and a current source. The current source is coupled between the input differential pair and a low voltage rail and configured to control whether the fully-differential preamplifier is operating in a first mode or a second mode, wherein the preamplifier draws more current when operating in the second mode compared to when operating in the first mode. The input differential pair is coupled between the output current load and the current source. The output current load is coupled between a high voltage rail and the input differential pair. The input differential pair comprise positive and negative inputs (INP and INM) of the fully-differential preamplifier. Nodes where the input differential pair and the output current load are coupled to one another comprise positive and negative outputs (OUTP and OUTM) of the fully-differential preamplifier. In accordance with certain embodiments, the input differential pair includes: first and second N-channel metal-oxide-semiconductor field-effect transistors (MOSFETs) (Mn1 and Mn2), each of which includes a gate, a drain, and a source. The sources of first and second N-channel MOSFETs (Mn1 and Mn2) are connected to one another. The drain of the first N-channel MOSFET (Mn1) comprises the negative output (OUTM) of the fully-differential preamplifier. The drain of the second N-channel MOSFET (Mn2) comprises the positive output (OUTP) of the fully-differential preamplifier. The gate of the first N-channel MOSFET (Mn1) comprises the positive input (INP) of the fully-differential preamplifier. The gate of the second N-channel MOSFET (Mn2) comprises the negative input (INM) of the fully-differential preamplifier. The current source is connected between the connected together sources of the first and second N-channel MOSFETs (Mn1 and Mn2) and the low voltage.

In accordance with certain embodiments, the output current load includes first and second P-channel MOSFETs (Mp1 and Mp2), each of which includes a gate, a drain, and a source. The sources of the first and second P-channel MOSFETs (Mp1 and Mp2) are connected to one another and to the high voltage rail. The drain of the first P-channel MOSFET (Mp1) is coupled to the drain of the first N-channel MOSFET (Mn1) and also comprise the negative output (OUTM) of the fully-differential preamplifier. The drain of the second P-channel MOSFET (Mp2) is coupled to the drain of the second N-channel MOSFET (Mn2) and also comprise the positive output (OUTP) of the fully-differential preamplifier.

In accordance with certain embodiments, the fully-differential preamplifier further comprises: a first resistor and a first switch connected in parallel with one another between the gate and the drain of the first N-channel MOSFET (Mn1); a second resistor and a second switch connected in parallel with one another between the gate and the drain of the second N-channel MOSFET (Mn2); a third resistor and a third switch connected in parallel with one another between the gate and the drain of the first P-channel MOSFET (Mp1); and a fourth resistor and a fourth switch connected in parallel with one another between the gate and the drain of the second P-channel MOSFET (Mp2). The first, second, third and fourth switches are configured to reset an operating voltage of the fully-differential preamplifier when the first, second, third, and fourth switches are simultaneously closed.

In accordance with certain embodiments, the fully-differential preamplifier further comprises a pair of blanking switches that are configured to force a zero voltage differential between the positive and negative inputs (INP and INM), in response to the blanking switches being simultaneously closed. The fully-differential amplifier is configured to output a substantially zero voltage differential between the positive and negative outputs (OUTP and OUTM) while the pair of blanking switches are both closed.

In accordance with certain embodiments, a first capacitor is coupled between the gate and the source of the first P-channel MOSFET (Mp1), and a second capacitor coupled between the gate and the source of the second P-channel MOSFET (Mp2). The first and second capacitors are configured to maintain voltages at the gates of the first and second P-channel MOSFETs (Mp1 and Mp2) so that the first and second P-channel MOSFETs (Mp1 and Mp2) act as current sources and increase an impedance of the fully-differential preamplifier, compared to if the first and second capacitors were not present.

In accordance with certain embodiments, a first high pass filter and a first direct current (DC) blocking capacitor are coupled between positive input (INP) and a first electrode, and a second high pass filter and a second DC blocking capacitor coupled between the negative input (INM) and a second electrode.

This summary is not intended to be a complete description of the embodiments of the present technology. Other features and advantages of the embodiments of the present technology will appear from the following description in which the preferred embodiments have been set forth in detail, in conjunction with the accompanying drawings and claims.

BRIEF DESCRIPTION OF THE DRAWINGS

Embodiments of the present technology relating to both structure and method of operation may best be understood by referring to the following description and accompanying drawings, in which similar reference characters denote similar elements throughout the several views.

DETAILED DESCRIPTION

Figure 1:
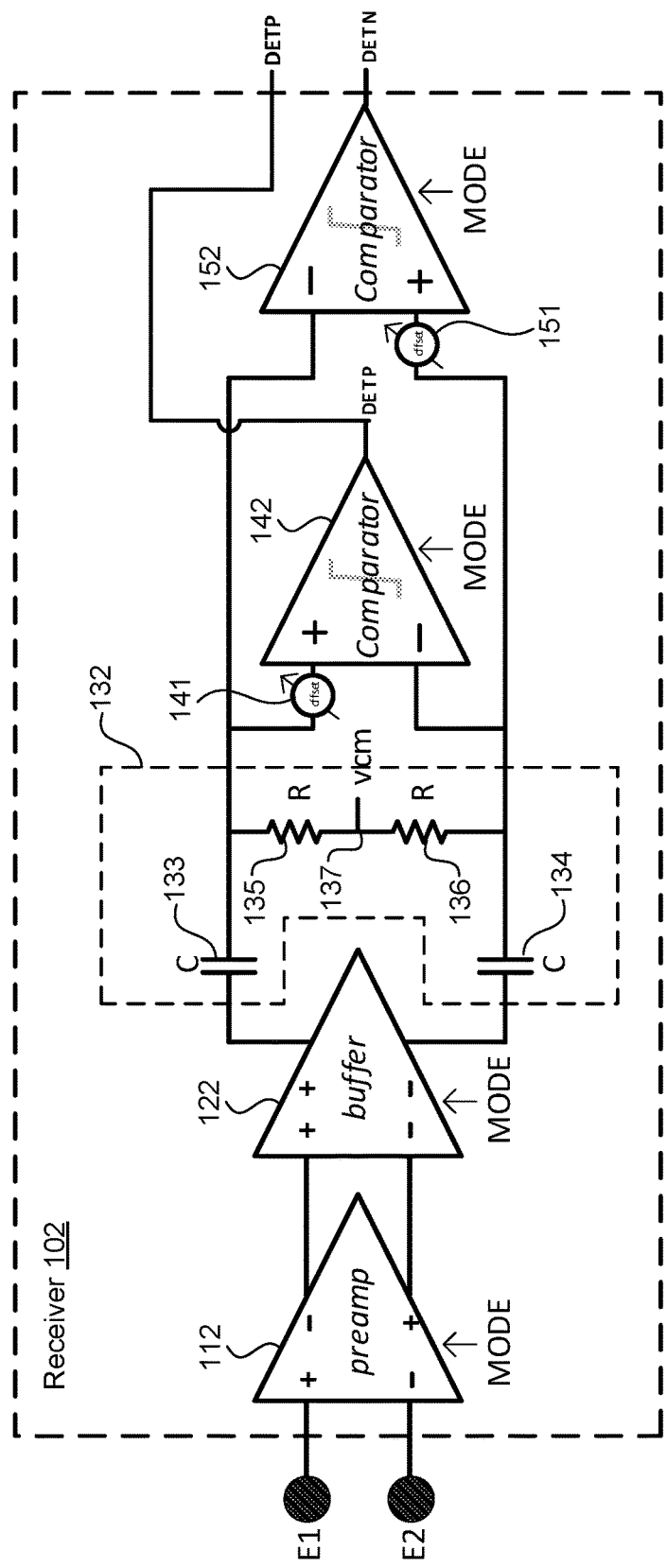
FIG. 1 shows a fully-differential receiver for use in an implantable medical device (IMD) and configured to receive conducted communication signals that are transmitted by another IMD or an external device, according to an embodiment of the present technology.

Where a conducted communication signal is transmitted from a first IMD to a second IMD, each of which includes two electrodes, a receiver of the second IMD may be implemented as a single ended receiver. When a receiver is single ended, that means one of the two electrodes is connected to the device ground. This essentially means that only one of the two electrodes is being used to monitor for and detect a conducted communication signal. Having one of the two electrodes (across which the conducted communication signal is received) directly connected to ground limits flexibility as far as how the electrodes must be electrically connected to the receiver to be used as receiving electrodes. Moreover, sensitivity of a single ended receiver is greatly dependent on the signal polarity, and more specifically, on how the signal polarity appears with respect to the input of the receiver. This can be problematic because the polarity of the received conducted communication signal is not usually known a priori, as it may change with posture, blood circulation, heart wall motion, and/or the IMD's implant location. Another issue with single ended receivers is that they typically have a high sensitivity to noise. Indeed, power supply and ground noise often adversely affect a single ended receiver. To reduce the chances of false detections of conducted communication pulses, a low noise power supply is typically required for a single ended receiver, which may increase the cost, size, and complexity of the power supply.

Further, where another type of IMD, such as a subcutaneous implantable cardioverter defibrillator (S-ICD), detects conducted communication signals across three or more electrodes, or a subset thereof, a single ended receiver will not work for detecting conducted communication signals between each possible set or subset (e.g., pair) of the electrodes due to its limitations on how electrodes must be connected to a single ended receiver.

As will be described below, certain embodiments of the present technology relate to a fully-differential receiver that is especially useful for enabling an IMD to receive conducted communication signals. The fully-differential receiver solution described herein overcomes most of the limitations of a single ended receiver discussed above, namely: 1) sensitivity is independent of the received signal polarity, and therefore there is less dependency on device orientation or pulse shape (monophasic versus biphasic); 2) there is better immunity to power supply and ground noise since noise is not seen as a direct differential signal (this provides for a cost reduction as an external capacitor is not required for a dedicated quiet noise supply); 3) support of multi electrode systems, such as S-ICDs, since there are no requirements as far as how electrodes are connected electrically to the receiver; 4) infrequent need for periodically auto zeroing the receiver (which reduces message loss rate); and 5) multi-mode operation is supported by the circuitry (there is low bandwidth and high bandwidth on demand programmability).

FIG. 1 shows a fully-differential receiver 102, according to an embodiment of the present technology. The fully-differential receiver 102 is shown as including a plurality of stages, which stages include a fully-differential preamplifier 112, a fully-differential buffer 122, an alternating-current (AC) coupling network 132, and two comparators 142, 152. The aforementioned stages, with the exception of the AC coupling network 132, are active stages that each include one or more active devices, such as transistors. By contrast, the AC coupling network 132 is a passive stage that includes only passive devices, such as resistors and capacitors. Fully-differential inputs of the receiver 102, and more specifically fully-differential inputs of the fully-differential preamplifier 112 of the receiver 102, are shown as being coupled to electrodes E1, E2. The electrodes E1, E2 are used to sense conducted communication signals transmitted by another IMD, which conducted communication signals are significantly attenuated by the time they are sensed by the electrodes E1, E2, and likely include peaks that are sub-millivolt (mV) in amplitude. As will be described in further detail below, the same electrodes E1, E2 can also be used for transmitting conducted communication signals to another IMD. Depending on the specific implementation, the same electrodes E1, E2 can also be used for sensing a signal indicative of cardiac electrical activity, such as an electrogram (EGM) or an electrocardiogram (ECG). Additionally, or alternatively, the same electrodes E1, E2 can also be used for delivering cardiac stimulation, and more specifically, cardiac pacing pulses and/or defibrillation shocks. The electrodes E1, E2 can also be used to sense conducted communication signals transmitted by an external device, such as an external programmer, as well as to transmit conducted communication signals to an external device or another IMD.

The fully-differential preamplifier 112, which can also be referred to herein more succinctly as the preamplifier 112, is shown as having differential input terminals, including a negative (−) input terminal and a positive (+) input terminal. The preamplifier 112 is also shown as having differential output terminals, including a positive (+) output terminal and a negative (−) output terminal. The preamplifier 112 amplifies low amplitude (e.g., sub-millivolt (mV)) conducted communication signals sensed across the electrodes E1, E2. In accordance with certain embodiments of the present technology, the preamplifier 112 has a gain within the range of 50 dB to 70 dB. However, in other embodiments, the preamplifier 112 can have a gain above or below the aforementioned range. A specific implementation of the fully-differential preamplifier 112, according to an embodiment of the present technology, is described below with reference to FIG. 3. The receiver 102 can alternatively include a preamplifier that differs from the one shown in FIG. 3.

It is noted that any negative (−) terminal described herein can alternatively be referred to as an inverting (−) terminal, and any positive (+) terminal described herein can alternatively be referred to as a non-inverting (+) terminal. More specifically, each negative (−) input terminal referred to herein can alternatively be referred to more succinctly as a negative (−) input, as an inverting (−) input terminal, or an inverting (−) input. Similarly, each positive (+) input terminal can alternatively be referred to more succinctly as a positive (+) input, as a non-inverting (+) input terminal, or a non-inverting (+) input. Each negative (−) output terminal referred to herein can alternatively be referred to more succinctly as a negative (−) output, as an inverting (−) output terminal, or an inverting (−) output. Similarly, each positive (+) output terminal can alternatively be referred to more succinctly as a positive (+) output, as a non-inverting (+) output terminal, or a non-inverting (+) output. A positive input can also be referred to or labeled INP, and a negative input can also be referred to or labeled INM (where the "M" stands for minus, aka, negative). A positive output can also be referred to or labeled OUTP, and a negative output can also be referred to or labeled OUTM.

The fully-differential buffer 122 and the AC coupling network 132 decouple the differential outputs of the preamplifier 112 from subsequent downstream circuitry, including the comparators 142, 152, to reduce and preferably minimize loading on the downstream circuitry and remove any preamplifier output offset. The fully-differential buffer 122, which can also be referred to herein more succinctly as the buffer 122, is shown as having differential input terminals, including a negative (−) input terminal and a positive (+) input terminal. The buffer 122 is also shown as having differential output terminals, including a negative (−) output terminal and a positive (+) output terminal. In accordance with an embodiment, the buffer 122 has unity gain.

In the embodiment shown in FIG. 1, the AC coupling network 132 is shown as including capacitors 133, 134, and resistors 135, 136. The capacitors 133, 134 are matching, meaning they have substantially the same capacitive values.

The resistors 135, 136 are also matching, meaning they have substantially the same resistive values. Between the resistors 135, 136 is a common mode voltage (vcm) node 137, which can be coupled to ground, or to a common mode voltage source, depending upon the specific implementation. A voltage at the vcm node 137 can be referred to as the Common Mode Voltage (VCM). The AC coupling network 132 is configured to remove any DC offset that may be caused by the fully-differential preamplifier 112 and the fully-differential buffer 122. An output DC biasing point of the AC coupling network 132 is the Common Mode Voltage (VCM) at the vcm node 137. When two devices (e.g., resistors or capacitors) have substantially the same values, that means that one value is within +/−5 percent of the other, and/or vice versa.

The capacitor 133 of the AC coupling network 132 is coupled between the positive (+) output terminal of the buffer 122 and the positive (+) input terminal of the comparator 142, wherein as discussed in more detail below, an offset 141 is specified at the positive (+) input terminal of the comparator 142. The capacitor 133 of the AC coupling network 132 is also coupled between the positive (+) output terminal of the buffer 122 and the negative (−) input terminal of the comparator 152. The capacitor 134 of the AC coupling network 132 is coupled between the negative (−) output terminal of the buffer 122 and the negative (−) input terminal of the comparator 152. The capacitor 134 of the AC coupling network 132 is also coupled between the negative (−) output terminal of the buffer 122 and the positive (+) input terminal of the comparator 152, wherein as discussed in more detail below, an offset 151 is specified at the positive (+) input terminal of the comparator 152. The resistor 135 is coupled between the vcm node 137 and the positive (+) input terminal of the comparator 142, and between the vcm node 137 and the negative (−) input terminal of the comparator 152. The resistor 136 is coupled between the vcm node 137 and the negative (−) input terminal of the comparator 142, and between the vcm node 137 and the positive (+) input terminal of the comparator 152.

The two comparators 142, 152 each have a programmable threshold, specified by the offsets 141, 151 at their respective positive (+) input terminals, which programmable thresholds are used to detect a conducted communication signal and report detections, respectively, of positive and negative conducted communication pulses with an indication of received polarity (DETP, DETN). The programmable threshold of the comparator 142 is specified by the offset 141 at its positive (+) input terminal, and the programmable threshold of the comparator 152 is specified by the offset 151 at its positive (+) input terminal, as noted above. Accordingly, as can be appreciated from FIG. 2, discussed below, each of the comparators 142, 152 will report a respective detection in response to a biphasic pulse of a conducted communication signal being received by the receiver 102. More specifically, the comparator 142 will produce a positive detection pulse (DETP) in response to a positive portion of a received biphasic pulse exceeding the offset 141 at the positive (+) input terminal of the comparator 142, and the comparator 152 will produce a negative detection pulse (DETN) in response to a negative portion of the received biphasic pulse exceeding the offset 151 at the positive (+) input terminal of the comparator.

The respective offset 141, 152 or each of the comparators 142, 152, which can also be referred to as input offset voltage, specifies the voltage potential difference that must exist between the positive (+) and negative (−) input terminals of the comparator in order for the output of the comparator to change from one logic level to the other (i.e., from LOW to HIGH, or vice versa). In accordance with certain embodiments, each of the comparators 142, 152 includes a respective transistor pair (also known as a load transistor pair, or an input pair) that are used to provide differential inputs of the comparator, and in such embodiments, the offsets 141, 151 can be achieved by a mismatch of the transistor pairs. The offsets 141, 151 can be programmable by utilizing a bank of transistors within each transistor pair, whereby transistors within the bank of transistors can be switched into or out of the transistor pair to thereby program an extent of the offsets 141, 151.

In accordance with certain embodiments of the present technology, MODE control signals are used to control a sensitivity of the receiver 102 to various pulse widths by increasing or decreasing current biasing in each active stage of the receiver 102. Such mode control signals are each labeled MODE in FIG. 1. The higher the bias current, the more sensitive the receiver 102 is to narrow pulses. A controller (not shown in FIG. 1, but which can be the controller 412, in FIG. 4, but is not limited thereto) can control the MODE control signals, e.g., can selectively increase and decrease magnitudes of the MODE control signals. Each active stage of the receiver 102 can have its own respective low bias current and high bias current that is tailored to the requirements of the active stage, wherein the respective low bias current is used when the receiver 102 is in the low current LF mode, and the respective high bias current is used when the receiver 102 is in the higher current HF mode. For example, the preamplifier 112 will have its own high bias current and low bias current, which are transitioned between based on the MODE control signal provided to the preamplifier 112. Similarly, the buffer 122 will have its own high bias current and low bias current, which are transitioned between based on the MODE control signal provided to the buffer 122. Further, the comparators 142 and 152 can have their own high bias current and low bias current, which are transitioned between based on the MODE control signal(s) provided to the comparators. If the comparators 142 and 152 include the same circuitry, then the high bias currents and the low bias currents can have the same magnitudes for the comparators 142 and 152. In other words, when the fully-differential receiver 102 operates in the low current LF mode, the fully-differential preamplifier 112, the fully differential buffer 122, the comparator 142, and the comparator 152 are provided with respective first biasing currents; and when the fully-differential receiver 102 operates in the higher current HF mode, the fully-differential preamplifier 112, the fully differential buffer 122, the comparator 142, and the comparator 152 are provided with respective second biasing currents that collectively consume more power from a battery compared to the first biasing currents. More generally, when the receiver 102 is in the low current LF mode the receiver draws a first amount of current, and when the receiver 102 is in the higher current HF mode the receiver draws a second amount of current that is greater than the first amount of current.

In accordance with an embodiment of the present technology, the receiver 102 can be selectively put in its low current LF mode, or in its higher current HF mode, on demand. The low current LF mode can also be referred to more generally herein as an alert mode or a first mode of operation, and the higher current HF mode can be referred to more generally herein as a decoding mode or a second mode of operation, wherein the second mode of operation drains more current and thereby more power from a battery compared to the first mode of operation. In accordance with an embodiment, while the receiver 102 is in its low current LF mode, the receiver 102 draws a low current that is on the order of a few hundred nanoamps (nA). When the receiver 102 is in the low current LF alert mode, the receiver 102 monitors for a LF wakeup signal, which can include a LF wakeup pulse, but is not limited thereto. An example of such a LF wakeup pulse is labeled 202 in FIG. 2, which is discussed below. Alternatively, the LF wakeup signal can include more than a single wakeup pulse. For example, a LF wakeup signal can instead include a two or three pulses having either the same or different predetermined widths that are separated by one or more predetermined temporal gaps. Other variations are also possible and within the scope of the embodiments described herein. For the remainder of this discussion, it is assumed that the LF wakeup signal includes a single LF wakeup pulse (e.g., labeled 202 in FIG. 2). However, as just explained above, that need not be the case.

Still referring to FIG. 1, in response to detecting a LF wakeup signal (e.g., which can include the pulse 202 in FIG. 2), the receiver 102 transitions to the higher current HF mode. In accordance with certain embodiments, when the receiver 102 is in the higher current HF mode it draws a current from a power source (e.g., a battery) that is at least twice the current that the receiver 102 draws when in the low current LF mode. In accordance with specific embodiments, when the receiver 102 is in the higher current HF mode it draws a current that is at least an order of magnitude (i.e., at least ten times) the current that the receiver 102 draws when in the low current LF mode.

When the receiver 102 is in the higher current HF mode, the receiver 102 is used to monitor for and receive HF (e.g., microsecond width) message content pulses, or more generally, a message content signal. In this manner, the receiver 102 adapts its current consumption to the received conducted communication signal, thereby reducing (and preferably minimizing) battery current consumption when possible.

Figure 2:
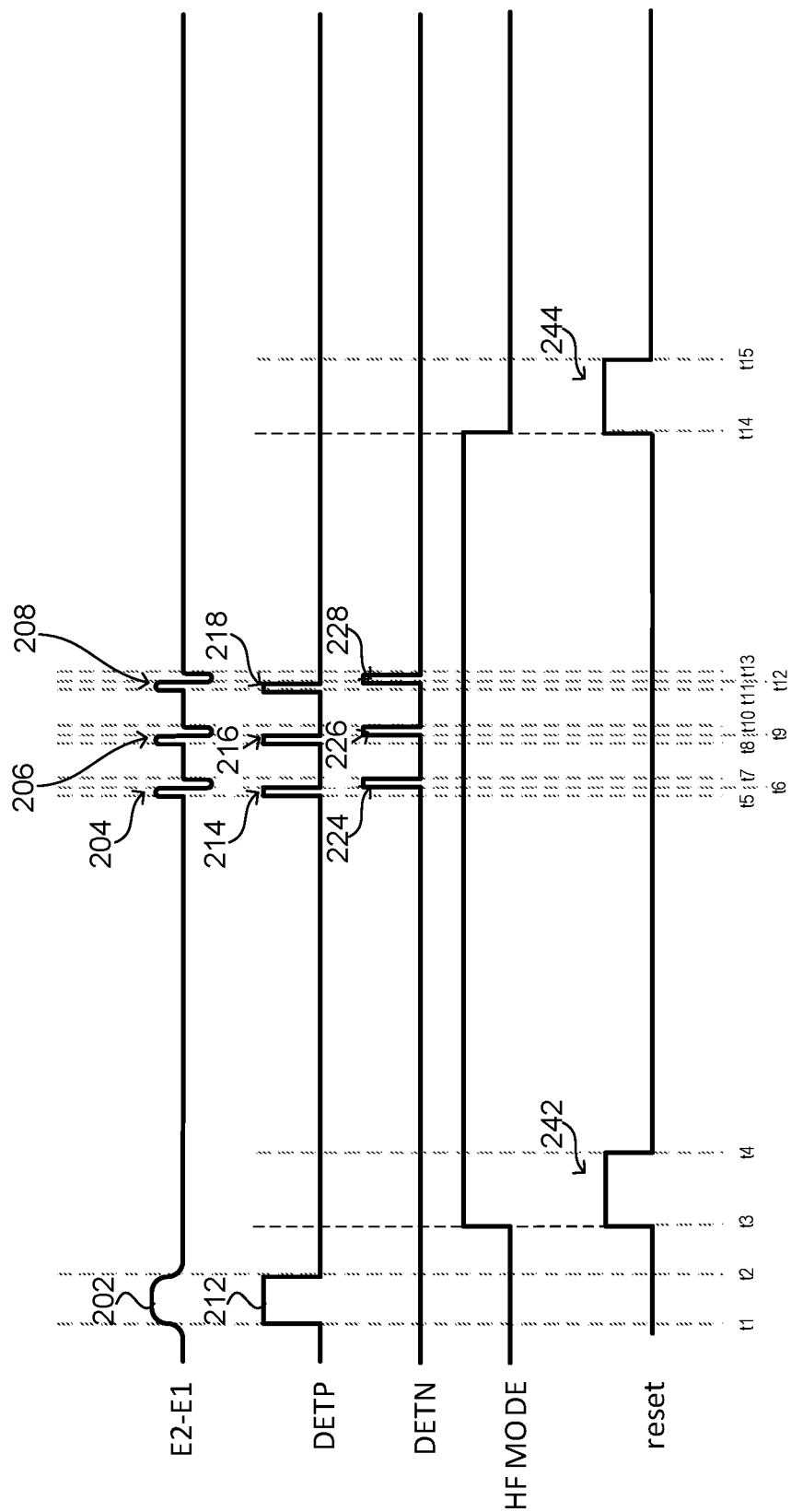
FIG. 2 shows an example timing diagram that is used to explain operation of the fully-differential receiver introduced in FIG. 1.

The example timing diagram in FIG. 2 is now used to further explain the operation of the receiver 102, including how the receiver 102 can change its mode of operation from the aforementioned low current LF mode, to the higher current HF mode, and vice versa. The uppermost waveform in FIG. 2, which is labeled E1-E2, illustrates an example signal sensed by the electrodes E1 and E2. The waveform labeled DETP illustrates an output of the comparator 142 in response to the signal sensed by the electrodes E1 and E2, and the waveform labeled DETN illustrates an output of the comparator 152 in response to the signal sensed by the electrodes E1 and E2. When a signal is sensed by the electrodes E1 and E2, it can alternatively be stated that a signal is sensed across the electrodes E1 and E2, or the signal is sensed between the electrodes E1 and E2. The waveform labeled HF MODE specifies when the receiver 102 is switched from the low current LF mode, to the higher current HF mode, and vice versa. More specifically, in the timing diagram of FIG. 2 when the HF MODE waveform is LOW the receiver 102 is in the low current LF mode, and when the HF MODE waveform is HIGH the receiver 102 is in the higher current HF mode.

The waveform labeled "reset" specifies when the receiver 102, and more specifically, the preamplifier 112 thereof, is reset. In accordance with certain embodiments, a reset pulse is produced whenever there is a transition from the low current LF mode to the higher current HF mode, as well as whenever there is a transition from the higher current HF mode to the low current LF mode. For example, still referring to FIG. 2, the reset pulse 242 is produced when there is a transition from the low current LF mode to the higher current HF mode. The reset pulse 244 is produced when there is a transition from the higher current HF mode to the low current LF mode. In accordance with certain embodiments, the reset pulses (e.g., 242, 244) are used to turn ON (close) certain switches within the preamplifier 112 to thereby reset the preamplifier 112, and more generally, reset the receiver 102. The HF mode signal and the reset signal, examples of which are shown in FIG. 2, can be produced by a controller (e.g., the controller 412 in FIG. 4). In accordance with certain embodiments, the reset signal causes certain switches within the preamplifier 112 to be temporarily closed, to thereby reset operating point voltages within the preamplifier 112, and thereby, within the receiver 102.

In accordance with certain embodiments, a reset pulse 244 can also be used to reset operating point voltages within the preamplifier 112, and thereby, within the receiver 102, at additional times (besides when there is transition from the low current LF mode to the higher current HF mode, or there is a transition from the higher current HF mode to the low current LF mode). For example, if the receiver 102 has not detected a LF wakeup signal for at least a specified period of time (e.g., 5 seconds, 10 seconds, 1 minute, 5 minutes, 1 hour, 2 hours, 24 hours, but not limited thereto), then a controller of the receiver 102 can cause an instance of the reset pulse 244 to be produced to thereby reset operating point voltages of the receiver 102, just in case drift in one or more of the operating point voltages has adversely affected the receiver's ability to detect a LF wakeup signal. Such a period of time, which can have a default or programmed duration, can be tracked using a clock that counts down or counts up, but is not limited thereto.

Still referring to FIG. 2, in the example timing diagram shown therein, while the receiver 102 is in the low current LF mode, a wide LF pulse 202 is detected by the receiver 102, which causes the receiver 102 to switch to the higher current HF mode. More specifically, the electrodes E1 and E2 detect the wide LF pulse 202 between times t1 and t2, which causes a detection pulse 212 to be produced at the output of the comparator 142 between the times t1 and t2. The wide LF pulse 202 can also be referred to herein as a wakeup pulse, since it is used to wakeup the receiver 102 from its low current LF mode, and transition it to its higher current HF mode. The detection pulse 212 (which can also be referred to as a wakeup detection pulse 212), or an indication of the detection thereof, is provided to a controller (e.g., the controller 412 in FIG. 4), which in response to receiving the detection pulse 212 (or an indication of the detection thereof) causes the receiver 102 to transition from its low current LF mode, to its higher current HF mode. The controller achieves this by selectively increasing the magnitudes of the MODE control signals shown in FIG. 1. This has the effect of increasing the current and thereby power consumed by the receiver 102, which in-turn enables the receiver 102 to detect narrower and higher frequency pulses, such as the pulses detected between the times t5 and t13 in FIG. 2. In the timing diagram of FIG. 2, the wide LF pulse 202 (i.e., the wakeup pulse) is shown as being a positive pulse and results in the comparator 142 producing the DETP 212, which in turn results in the receiver 102 being switched to the higher current HF mode. The wide LF pulse can alternatively be a negative pulse that would result in the comparator 152 producing a DETN, which would that also cause the receiver 102 to be switched to the higher current HF mode. In other words, the receiver 102 can be changed from its low current LF mode to its higher current HF mode regardless of whether a received wakeup pulse has a positive polarity or a negative polarity. Further, as noted above, in certain embodiments, the LF wakeup signal can include more than a single wakeup pulse. For example, the LF wakeup signal can instead include a two or three pulses having either the same or different predetermined widths that are separated by one or more predetermined temporal gaps. Other variations are also possible and within the scope of the embodiments described herein.

When in the higher current HF mode, the receiver 102 is able to detect and distinguish a plurality of narrow HF biphasic pulses 204, 206, 208 and report detections for both positive polarities (as indicated by the pulses 214, 216, 218 generated at the output of the comparator 142) and negative polarities (as indicated by the pulses 224, 226, 228 generated at the output of the comparator 152). The narrow HF biphasic pulses 204, 206, 208 can be referred to as message content pulses, because they are encoded with a message from another IMD or from an external device. The pulses 214, 216, 218 generated at the output of the comparator 142 can be referred to as the positive detection pulses, or as the DETP pulses. The pulses 224, 226, 228 generated at the output of the comparator 152 can be referred to as the negative detection pulses, or as the DETN pulses. The DETP pulses can be collectively referred to as a DETP signal, and the DETN pulses can be collectively referred to as a DETN signal. The DETP pulses, the DETN pulses, or preferably both the DETP and DETN pulses, are decoded to determine the message content that was/were encoded therein by the IMD or external device that transmitted the conducted communication signal that was received by the receiver 102. Such decoding can be achieved by providing the DETP and/or DETN pulses to a microprocessor (e.g., of a controller 412 in FIG. 4) of the IMD, or alternatively by providing the DETP and/or DETN pulses to a logic detector (e.g., 421 in FIG. 4) that converts the pulses into logic levels (HIGH and LOW) that are provide to the controller (e.g., a microprocessor) of the IMD. Such a logic detector can be implemented, e.g., using logic gates, a state machine, and/or the like.

Still referring to FIG. 2, in accordance with certain embodiments the duration between the end of the wakeup pulse 202 and the start of the first narrow HF biphasic pulse 204 (i.e., the start of the first message content pulse), which is the duration between time t2 and time t5, is a predetermined interval, so that the receiver and/or a logic detector (e.g., 421 in FIG. 4) knows when to expect the message content pulses following the wakeup pulse 202. In accordance with certain embodiments, the message content pulses are delivered within a temporal window having a predetermine duration, at the end of which the receiver 102 transitions back to its low current LF mode until another wakeup pulse 202 is received (or more generally, until another wakeup signal is received). In other words, there can be a transition from the higher current HF mode back to the low current LF mode at an end of a predetermined duration, which can be measured using a clock that counts down or counts up, but is not limited thereto. For an example, such a window can have a duration from the time t3 to the time t14.

Various techniques can be used to encode information onto the message content pulses, including, but not limited to, a delay between consecutive message content pulses, a delay between non-consecutive message content pulses (e.g., between the first and last message content pulses within a window), and/or the like. For example, a first message type (e.g., a first event message) may be represented by a first HF biphasic pulse, followed by a second HF biphasic pulse at a time duration T after first HF biphasic pulse, followed by a third HF biphasic pulse at a time duration 3T after second HF biphasic pulse and a time duration 5T after first HF biphasic pulse (wherein the time duration T is predetermined unit of time). A second message type (e.g., a second event message) may be represented as a first HF biphasic pulse, followed by a second HF biphasic pulse at a time duration 2T after first HF biphasic pulse, followed by a third HF biphasic pulse at a time duration 4T after second HF biphasic pulse and a time duration 7T after first HF biphasic pulse. Under such a scheme, a receiver, a logic detector, and/or a controller of an IMD can perform pattern matching to detect the various different message types. This concept can be further expanded by adding more transmitted bits and a larger range of spacing to handle multiple bit errors if needed, but there will be additional cost in both transmit and receive currents. Other variations are also possible and within the scope of the embodiments described herein.

In this disclosure, whenever it is stated the receiver 102, or a stage thereof, draws more current and thereby more power in one mode than another mode, it should be understood that such a comparison is per common unit of time, e.g., per microsecond or per second. For example, it has often been explained above that the receiver 102 draws more current and thereby more power when operating in its higher current HF mode than when operating in its low current LF mode. For a more specific example, the current drain when the receiver 102 is operating in the higher current HF mode can be at least ten times (i.e., 10×) the current drain when the receiver 102 is operating in the low current LF mode, per common unit of time. However, because the receiver 102 may spend 99% of its time operating in the low current LF mode, and only spend 1% of its time operating in the higher current HF mode, collectively over time, more of the current and power of the receiver's battery may be consumed during the low current LF mode than during the higher current HF mode. Nevertheless, it is still appropriate to explain that the receiver 102 draws more current and thereby more power when operating in its higher current HF mode than when operating in its low current LF mode, because that is true per common unit of time.

Preamplifier

Figure 3:
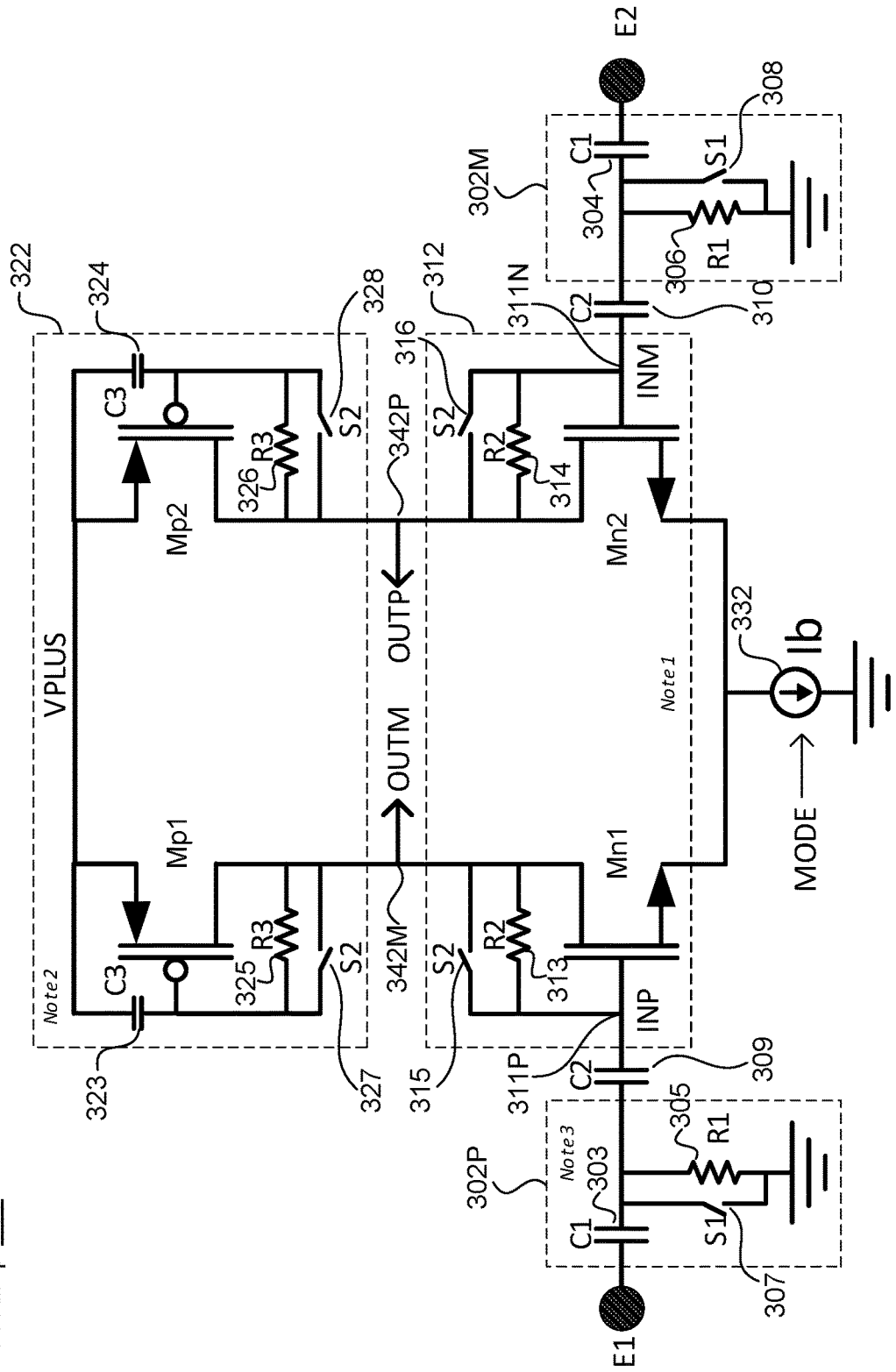
FIG. 3 shows details of a fully-differential preamplifier that can be included in the fully-differential receiver introduced in FIG. 1.

FIG. 3 shows a circuit diagram of the fully-differential preamplifier 112, according to an embodiment of the present technology. Referring to FIG. 3, the fully-differential preamplifier 112 is shown as including an input differential pair 312, an output current load 322, and a current source 332. Inputs or nodes 311P, 311M of the input differential input pair 312, which are also labeled INP and INM, receive the signals sensed across the electrodes E1, E2, and more specifically, high pass filtered versions of such signals. The input INP can also be referred to as a positive input, and the input INM can also be referred to as a negative input. The fully-differential preamplifier 112 can also be referred to more succinctly as the preamplifier 112.

In FIG. 3, a high pass filter (HPF) 302P and a direct current (DC) blocking capacitor 309 are shown as being coupled between the electrode E1 and the input node 311P (also labeled INP) of the input differential pair 312. Similarly, a high pass filter (HPF) 302M and a DC blocking capacitor 310 are shown as being coupled between the electrode E2 and the input node 311N (also labeled INM) of the input differential pair 312. The HPF 302P and the HPF 302M pass signals above the cutoff frequency (specified by the values of the capacitors 303, 304 and the resistors 305, 306) and filter out signals below the cutoff frequency, including low frequency cardiac signals sensed by the electrodes E1, E2. In accordance with certain embodiments, the cutoff frequency can be in the range of 200 to 500 Hz, e.g., can be 250 Hz, but is not limited thereto. The capacitors 303, 304 are matching, meaning they have substantially the same capacitive values, i.e., C1. The resistors 305, 306 are matching, meaning they have substantially the same resistive values, i.e., R1. The DC blocking capacitors 309, 310 are matching, meaning they have substantially the same capacitive values, i.e., C2. The HPFs 302P, 302M also provide for electromagnetic field interference (EMI) reduction, as well as offer full flexibility in how the electrodes E1, E2 are electrically connected to inputs of the receiver 102. Terminals of the capacitors 309, 310 (on the electrode sides) are grounded through the resistors 305, 306, respectively, no matter what level the electrodes E1, E2 are biased at relative to the inputs of the receiver 102. The capacitors 303, 304 also provide AC coupling from the electrodes E1, E2, allowing the electrodes E1, E2 to be biased at any voltage with respect to the receiver inputs.

In the embodiment shown in FIG. 3, the input differential pair 312 includes a differential pair of N-channel metal-oxide-semiconductor field-effect transistors (MOSFETs) Mn1, Mn2, which can also be referred to as transistors Mn1, Mn2. Each of the transistors Mn1, Mn2 includes a gate, a drain, and a source. The gate of the transistor Mn1 is coupled to one of the terminals of the capacitor 309, and the gate of the transistor Mn2 is coupled to one of the terminals of the capacitor 310. The sources of the transistors Mn1, MN2 are connected to one another, and the current source 332 is connected between the connected together sources of the transistors Mn1, MN2 and ground (or some other low voltage rail, that need not be ground). The drain of the transistor Mn1 is the negative (−) output terminal of the fully-differential preamplifier 112, which negative (−) output terminal is labeled OUTM (as well as labeled 342M). The drain of the transistor Mn2 is the positive (+) output terminal of the fully-differential preamplifier 112, which positive (+) output terminal is labeled OUTP (as well as labeled 342P). The input differential pair 212 also includes a resistor 313 connected between the gate and the drain of the transistor Mn1, and a resistor 314 connected between the gate and the drain of the transistor Mn2. The resistors 313, 314 are matching, meaning they have substantially the same resistive values, i.e., R2. A switch 315 is connected in parallel with the resistor 313 between the gate and the drain of the transistor Mn1. Similarly, a switch 316 is connected in parallel with the resistor 314 between the gate and the drain of the transistor Mn2. When the switches 315 and 316 are selectively closed, e.g., by a controller (e.g., the controller 412 in FIG. 4), the transistors Mn1 and Mn2 become diode connected transistors.

The output current load 322 includes a differential pair of P-channel MOSFETs Mp1, Mp2, which can also be referred to as transistors Mp1, Mp2. Each of the transistors Mp1, Mp2 includes a gate, a drain, and a source. The output current load 322 includes a capacitor 323 connected between a high voltage rail (VPLUS) and the gate of the transistor Mp1, and another capacitor 324 connected between the high voltage rail (VPLUS) and the gate of the transistor Mp2. The sources of the transistors Mn1, MN2 are connected to one another, and to the high voltage rail (VPLUS). The drain of the transistor Mp1 is the negative (−) output terminal of the fully-differential preamplifier 112, which negative (−) output terminal is labeled OUTM (as well as labeled 342M). The drain of the transistor Mp2 is the positive (+) output terminal of the fully-differential preamplifier 112, which positive (+) output terminal is labeled OUTP (as well as labeled 342P). The capacitors 323, 324 are matching, meaning they have substantially the same capacitive values, i.e., C3. The output current load 322 also includes a resistor 325 connected between the gate and the drain of the transistor Mp1, and a resistor 326 connected between the gate and the drain of the transistor Mp2. The resistors 325, 326 are matching, meaning they have substantially the same resistive values, i.e., R3. A switch 327 is connected in parallel with the resistor 325 between the gate and the drain of the transistor Mp1. Similarly, a switch 328 is connected in parallel with the resistor 326 between the gate and the drain of the transistor Mp2. When the switches 327 and 328 are selectively closed, e.g., by a controller (e.g., the controller 412 in FIG. 4), the transistors Mp1 and Mp2 become diode connected transistors. The switches 315, 316, 327 and 328 are also all labeled R2 to indicate that they are all simultaneously opened and closed. In accordance with certain embodiments, each of these switches 315, 316, 327 and 328 is implemented using a respective CMOS transistor that is closed by turning the transistor ON, and is opened by turning the transistor OFF, under the control of a controller (e.g., the controller 412 in FIG. 4).

The biasing points of the input terminals 311P, 311N (i.e., INP, INM) and the output terminals 342M, 342P (i.e., OUTP, OUTM) are directly related to the bias current (Ib) provided by the current source 332. A reset is applied when switching from one mode to the other (i.e., whenever the bias current Ib changes) so that the preamplifier operating points are quickly set, and the receiver 102 (that includes the preamplifier 112) is ready to detect. Such a reset can be achieved by simultaneously and temporarily closing these switches 315, 316, 327 and 328, which as noted above, are also all labeled R2 to indicate that they are all simultaneously opened and closed. A reset event can be applied at any time if needed, although the receiver 102 (that includes the preamplifier 112) is not able to detect a signal during the duration of the reset.

The input differential pair 312 (including the resistors 313, 314), and the output current load 322 (including the resistors 325, 326 and the capacitors 323, 324) are used to provide a DC biasing point for the DC blocking capacitors 309, 310 on their INP or INM sides. The resistors 313, 314 (having the resistance R2) and the resistors 325, 326 (having the resistance R3) are very large (e.g., at least 100 MΩ) to provide high gain. The biasing current Ib provided by the current source 332 limits current into the differential pair of transistors Mn1, Mn2 and is controlled by the MODE control signal so the bias current Ib can be increased or decreased on-demand based on the situation. The MODE control signal can be controlled by a controller (e.g., the controller 412 in FIG. 4).

The resistors 325, 326 and the capacitors 323, 324 provide a built-in offset and mismatch compensation network for the output current load 322. The DC operating point at the outputs 342P, 342M (i.e., OUTP and OUTM) is based on each transistor's electrical parameters and the bias current Ib. The outputs 342P, 342M (i.e., OUTP and OUTM) may not be at the same voltage value since mismatch and other non-ideal factors can create slight differences in how much current goes in each side of the preamplifier 112. However, this is not critical when the preamplifier 112 is included in the receiver 102 since there is a buffer 112 and an AC coupling network 132 that removes the offset at the output of the preamplifier 112. The buffer 122 also reduces loading at the outputs 342P, 342M (i.e., OUTP and OUTM) in order to increase (and preferably maximize) a slew rate of the preamplifier 112.

The MODE control signal in FIG. 3 controls the bias current Ib produced by the current source 332, which can be implemented as a current sink. The narrower the transmitted pulse width or the smaller the space between transmitted pulses, the larger the bias current Ib should be. The consumption current can be precisely adjusted with the type of signal that is expected, e.g., a LF wakeup signal, or a HF message content signal.

The switches 307 and 308 (that are also labeled S1, and can also be referred to as the S1 switches) are blanking switches that can be used blank the input of the receiver 102 (i.e., to force a zero differential voltage between the inputs INP and INM) during certain events to avoid false detections of a wakeup signal and/or information encoded signal by the receiver 102. Examples of such events (during which the S1 switches should be closed, in order to blank the receiver 102) include: during a pacing event while the electrodes E1, E2 are being used for cardiac pacing (which pacing event can include both discharging of a storage capacitor and outputting of a pacing pulse); during a transmission event while the electrodes E1, E2 are being used to transmit one or more conducted communication signals; and during a reset event (when the S2 switches are closed). The switches 315, 316, 327 and 328 (that are also labeled S2, and can be referred to as the S2 switches) are used to quickly reset the receiver 102 when there is a change to the mode of operation, from the low current LF mode to the higher current HF mode, or vice versa, so that the receiver 102 is ready to receive. The above described switches can be controlled by a controller (e.g., 412 in FIG. 4) of an IMD (e.g., 402 in FIG. 4) within which the preamplifier 112 is included.

Example IMD

Figure 4:
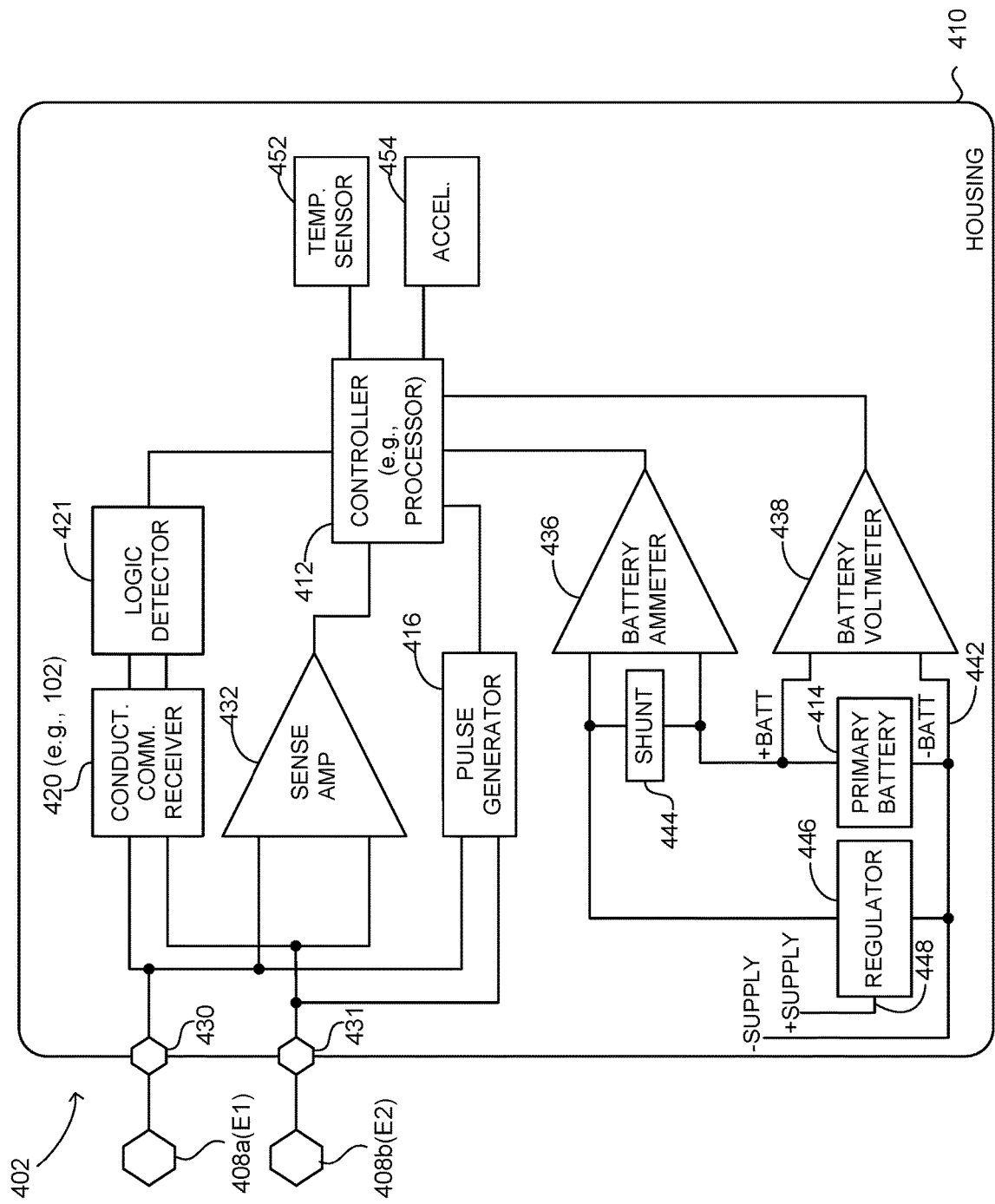
FIG. 4 is a high level block diagram of an example IMD that can include the fully-differential receiver introduced in FIG. 1, which can include the fully-differential preamplifier shown in FIG. 3.

FIG. 4 is a block diagram of an example IMD 402 that can include the fully-differential receiver 102 described above. FIG. 4 shows functional elements of the IMD 402 substantially enclosed in a hermetic housing 410. In certain embodiments, the IMD 402 is a leadless pacemaker that includes at least two leadless electrodes configured for delivering cardiac pacing pulses, sensing evoked and/or natural cardiac electrical signals, and uni-directional and/or bi-directional conducted communication. Alternatively, the IMD 402 can be implantable cardioverter defibrillator (ICD), such as a non-vascular ICD (NV-ICD), or an insertable cardiac monitor (ICM), but is not limited thereto.

Where the IMD 402 is a leadless pacemaker, its electrodes 408 (e.g., E1 and E2) are located within, on, or near the housing 410, for delivering pacing pulses to and sensing electrical activity from the muscle of the cardiac chamber, and for conducted communication with at least one other device within or outside the body. Hermetic feedthroughs 430, 431 conduct electrode signals through the housing 410. The housing 410 contains a primary battery 414 to supply power for pacing, sensing, and communication. The housing 410 also contains a circuit 432 for sensing cardiac activity from the electrodes 408, a conducted communication receiver 420 for receiving conducted communication signal from at least one other device via the electrodes 408, and a pulse generator 416. The pulse generator 416 can be used for generating pacing pulses for delivery via the electrodes 408 and/or also for transmitting conducted communication signals to at least one other device via the electrodes 408. The housing 410 can further contain circuits for monitoring device health, for example a battery current monitor 436 and a battery voltage monitor 438, and can contain circuits for controlling operations in a predetermined manner.

In FIG. 4 the two electrodes shown therein that are labeled 408a and 408b, can be the electrodes E1 and E2 shown in and described above with reference to FIGS. 1 and 3. Such electrodes can be referred to collectively as the electrodes 408, or individually as an electrode 408. It is also possible that the IMD 402 can include more than two electrodes, depending upon implementation. In FIG. 4, the IMD 402 is shown as including a conducted communication receiver 420 that is coupled to the electrodes 408 and configured to receive conducted communication signals from another IMD and/or from an external device, such as an external programmer. In accordance with certain embodiments of the present technology, the conducted communication receiver 420 is implemented using the fully-differential receiver 102 described above, initially with reference to FIG. 1. If the IMD 402 includes more than two electrodes, switches can be included between the electrodes and the inputs to conducted communication receiver 420 (implemented using the fully-differential receiver 102) to select which two electrodes are connected to the differential inputs of the receiver. If the IMD 402 includes more than two electrodes, switches may also be used to connect two or more electrodes together to increase the size of certain electrodes, so long as different electrode(s) is/are connected to positive input of the receiver than is/are connected to the negative input of the receiver.

In FIG. 4, the pulse generator 416 can function as a transmitter that transmits conducted communication signals using the electrodes 408 (which as noted above, can be the electrodes E1, E2). Depending upon the specific implementation, a pair of communication channels can be used to enable the IMD 402 to communicate with another IMD or an external device, or alternatively a common communication channel can be used. Usage of the electrodes 408 for communication enables the IMD 402 to perform antenna-less and telemetry coil-less communication. Where two IMDs communicate with one another using conducted communication, such conducted communication can be referred to as implant-to-implant (i2i) conducted communication.

Still referring to FIG. 4, the IMD is shown as including a controller 412 and a pulse generator 416. The controller 412 can include, e.g., a microprocessor (or equivalent control circuitry), RAM and/or ROM memory, logic and timing circuitry, state machine circuitry, and I/O circuitry, but is not limited thereto. The controller 412 can further include, e.g., timing control circuitry to control the timing of conducted communication pulses, as well as to control the timing the stimulation pulses (e.g., pacing rate, atrio-ventricular (AV) delay, atrial interconduction (A-A) delay, or ventricular interconduction (V-V) delay, etc.). Such timing control circuitry may also be used for the timing of refractory periods, blanking intervals, noise detection windows, evoked response windows, alert intervals, marker channel timing, and so on. The controller 412 can further include other dedicated circuitry and/or firmware/software components that assist in monitoring various conditions of the patient's heart and managing pacing therapies. The controller 412 and the pulse generator 416 may be configured to transmit event messages, via the electrodes 408, in a manner that does not inadvertently cause cardiac capture. In certain embodiment, the logic detector 421 can be implemented by the controller 412 itself.

The electrodes 408 can be configured to communicate bidirectionally among the multiple leadless cardiac pacemakers, a co-implanted ICD and/or a co-implanted ICM to coordinate pacing pulse delivery and optionally other therapeutic and/or diagnostic features using messages that identify an event at an individual IMD originating the message and an IMD receiving the message react as directed by the message depending on the origin of the message. Individual IMDs can be configured to issue a unique code corresponding to an event type and a location of the sending IMD.

Also shown in FIG. 4, the primary battery 414 has positive terminal 440 and negative terminal 442. Current from the positive terminal 440 of primary battery 414 flows through a shunt 444 to a regulator circuit 446 to create a positive voltage supply 448 suitable for powering the remaining circuitry of the IMD 402. The shunt 444 enables the battery current monitor 436 to provide the controller 412 with an indication of battery current drain and indirectly of device health. The illustrative power supply can be a primary battery 414.

Still referring to FIG. 4, the IMD 402 is also shown as including a temperature sensor 452. The temperature sensor 452 can be any one of various different types of well-known temperature sensors, or can be a future developed temperature sensor. The temperature sensor 452 can be used in various manners. For example, the temperature sensor 452 can be used to detect an activity level of the patient to adjust a pacing rate, i.e., for use in rate responsive pacing. Accordingly, the controller 412 can be configured to detect an activity level of a patient based on core blood temperature measurements obtained using the temperature sensor 452.

The IMD 402 is also shown as including an accelerometer 454 which can be hermetically contained within the housing 410. The accelerometer 454 can be any one of various different types of well-known accelerometers, or can be a future developed accelerometer. The accelerometer 454 can be used to detect an activity level of the patient to adjust a pacing rate, i.e., for use in rate responsive pacing. It would also be possible to use outputs of both the accelerometer 454 and the temperature sensor 452 to monitor the activity level of a patient.

The IMD 402 can manage power consumption to draw limited power from the battery 414, thereby reducing device volume. Each circuit in the system can be designed to avoid large peak currents. For example, cardiac pacing can be achieved by discharging a tank capacitor (not shown) across the pacing electrodes. Recharging of the tank capacitor is typically controlled by a charge pump circuit. In a particular embodiment, the charge pump circuit is throttled to recharge the tank capacitor at constant power from the battery.

Method

Figure 5:
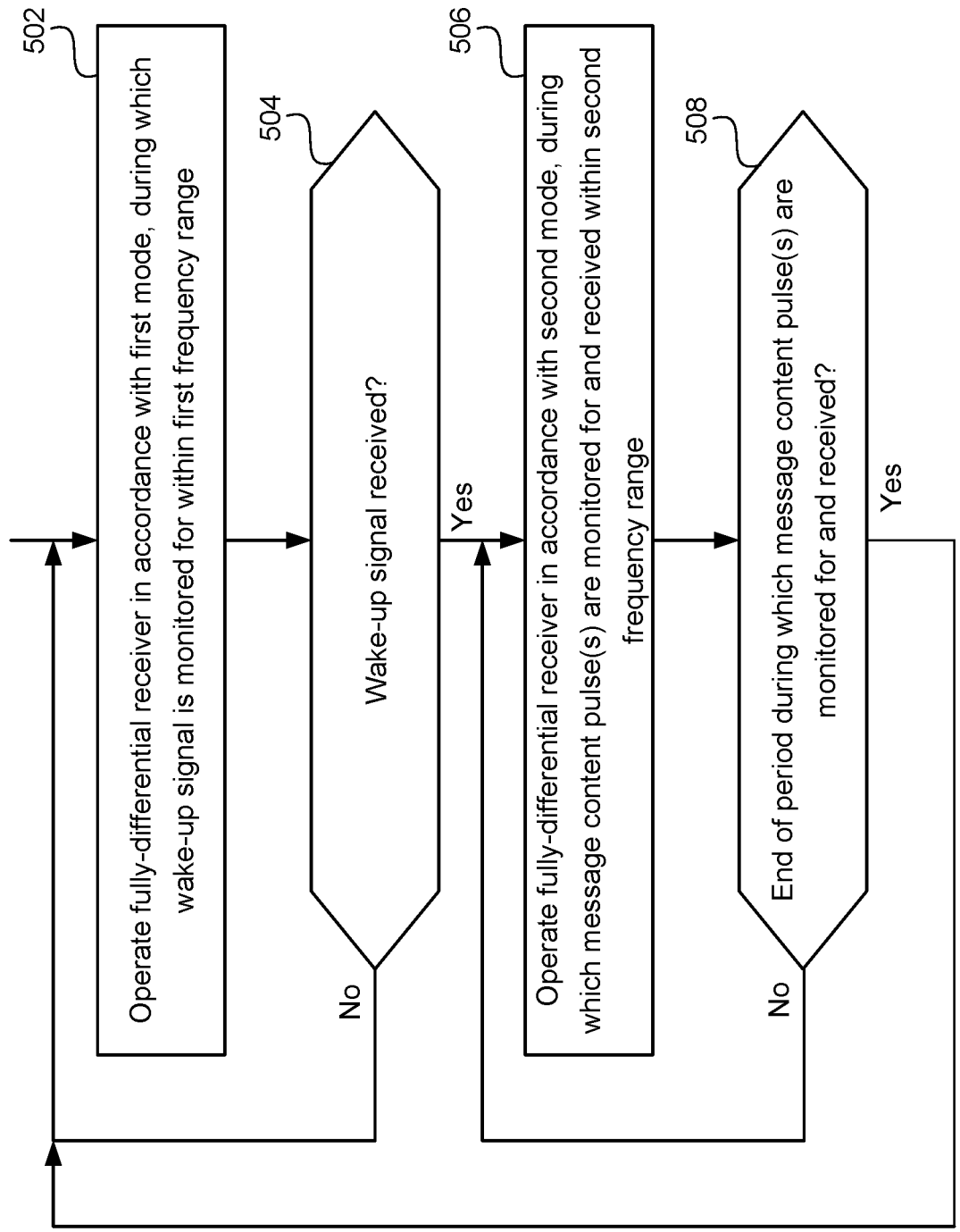
FIG. 5 is a high level flow diagram that is used to describe a method for operating a fully-differential receiver, such as the one introduced in FIG. 1, in accordance with certain embodiments of the present technology.

The high level flow diagram of FIG. 5 will now be used to describe a method according to an embodiment of the present technology, wherein the method is for use with a fully-differential receiver (e.g., 102, 420) of an IMD (e.g., 402), wherein the fully-differential receiver is powered by a battery (e.g., 414) of the IMD. Referring to FIG. 5, step 502 involves operating the fully-differential receiver in accordance with a first mode, during which a wakeup signal is monitored for within a first frequency range. As explained above, such a wakeup signal can include a LF wakeup pulse (e.g., pulse 202 in FIG. 2), but is not limited thereto. At step 504 there is a determination of whether the wakeup signal was received. If the answer to the determination at step 504 is No (i.e., if the wakeup signal was not received), then flow returns to step 502. If the answer to the determination at step 504 is Yes (i.e., if the wakeup signal was received), then flow goes to step 506. Step 506 involves operating the fully-differential receiver in accordance with a second mode, during which one or more message content pulses are monitored for and received within a second frequency range that is higher than the first frequency range. In other words, in response to detecting the wakeup signal while the fully-differential receiver is operating in the first mode, there is a change from operating the fully-differential receiver in accordance with the first mode to operating the fully-differential receiver in accordance with a second mode. The second mode drains more current and thereby more power from a battery compared to the first mode. An example of the first mode is the low current LF mode discussed above, and an example of the second mode is the higher current HF mode discussed above.

At step 508 there is a determination of whether the period during which message content pulse(s) are monitored for and received has ended. If the answer to the determination at step 508 is No, then flow returns to step 506. If the answer to the determination at step 508 is Yes, then flow returns to step 502, and there is a change from operating the fully-differential receiver in accordance with the second mode back to operating the fully-differential receiver in accordance with the first mode, which drains less current and thereby less power from the battery compared to the second mode. For an example, the answer to the determination at step 508 may be Yes because a message content window has ended, because an end of message indicator was received, or because a timeout period has expired, but not limited thereto. Other variations are also possible and within the scope of the embodiments described herein.

It is to be understood that the subject matter described herein is not limited in its application to the details of construction and the arrangement of components set forth in the description herein or illustrated in the drawings hereof. The subject matter described herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, it is noted that the term "based on" as used herein, unless stated otherwise, should be interpreted as meaning based at least in part on, meaning there can be one or more additional factors upon which a decision or the like is made. For example, if a decision is based on the results of a comparison, that decision can also be based on one or more other factors in addition to being based on results of the comparison.

Embodiments of the present technology have been described above with the aid of functional building blocks illustrating the performance of specified functions and relationships thereof. The boundaries of these functional building blocks have often been defined herein for the convenience of the description. Alternate boundaries can be defined so long as the specified functions and relationships thereof are appropriately performed. Any such alternate boundaries are thus within the scope and spirit of the claimed invention.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the embodiments of the present technology without departing from its scope. While the dimensions, types of materials and coatings described herein are intended to define the parameters of the embodiments of the present technology, they are by no means limiting and are exemplary embodiments. Many other embodiments will be apparent to those of skill in the art upon reviewing the above description. The scope of the embodiments of the present technology should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A fully-differential preamplifier having a differential pair of inputs including a positive input and a negative input, and a differential pair of outputs including a positive output and a negative output, the fully-differential preamplifier comprising:
    first and second N-channel metal-oxide-semiconductor field-effect transistors (MOSFETs), and first and second P-channel MOSFETs, each of which includes a gate, a drain, and a source;
    the sources of first and second N-channel MOSFETs connected to one another;
    the sources of the first and second P-channel MOSFETs connected to one another and to a high voltage rail;
    a current source connected between the connected together sources of the first and second N-channel MOSFETs and a low voltage rail;
    the gate of the first N-channel MOSFET comprising the positive input of the fully-differential preamplifier;
    the gate of the second N-channel MOSFET comprising the negative input of the fully-differential preamplifier;
    the drains of the first N-channel MOSFET and the first P-channel MOSFET connected to one another and comprising the negative output of the fully-differential preamplifier;
    the drains of the second N-channel MOSFET and the second P-channel MOSFET connected to one another and comprising the positive output of the fully-differential preamplifier;
    a first resistor and a first switch connected in parallel with one another between the gate and the drain of the first N-channel MOSFET;
    a second resistor and a second switch connected in parallel with one another between the gate and the drain of the second N-channel MOSFET;
    a third resistor and a third switch connected in parallel with one another between the gate and the drain of the first P-channel MOSFET; and
    a fourth resistor and a fourth switch connected in parallel with one another between the gate and the drain of the second P-channel MOSFET;
    wherein the first, second, third and fourth switches are configured to reset an operating voltage of the fully-differential preamplifier when the first, second, third, and fourth switches are simultaneously closed for a period of time.

2. The fully-differential preamplifier of claim 1, further comprising:
    a first capacitor coupled between the gate and the source of the first P-channel MOSFET; and
    a second capacitor coupled between the gate and the source of the second P-channel MOSFET;
    wherein the first and second capacitors are configured to maintain voltages at the gates of the first and second P-channel MOSFETs so that the first and second P-channel MOSFETs act as current sources and increase an impedance of the fully-differential preamplifier, compared to if the first and second capacitors were not present.

3. The fully-differential preamplifier of claim 2, wherein the differential pair of inputs of fully-differential preamplifier, which include the positive input and the negative input, are configured to be coupled to a pair of electrodes of an implantable medical device (IMD), and further comprising:
    a first high pass filter (HPF) coupled between a first one of the electrodes and the positive input; and
    a second high pass filter (HPF) coupled between a second one of the electrodes and the positive input;
    wherein the first and second HPFs are configured to filter out one or more signals indicative of cardiac electrical activity that may be sensed by the pair of electrodes.

4. The fully-differential preamplifier of claim 3, wherein:
    the first HPF comprises a third capacitor and a fifth resistor, the third capacitor including a first terminal and a second terminal, the first terminal of the third capacitor coupled to the first one of the electrodes, and the fifth resistor coupled between the second terminal of the third capacitor and the low voltage rail; and
    the second HPF comprises a fourth capacitor and a sixth resistor, the fourth capacitor including a first terminal and a second terminal, the first terminal of the fourth capacitor coupled to the second one of the electrodes, and the sixth resistor coupled between the second terminal of the fourth capacitor and the low voltage rail.

5. The fully-differential preamplifier of claim 4, further comprising:
    a fifth switch connected in parallel with the fifth resistor between the second terminal of the third capacitor and the low voltage rail; and
    a sixth switch connected in parallel with the sixth resistor between the second terminal of the fourth capacitor and the low voltage rail;
    wherein the fifth and sixth switches are configured to force a zero voltage differential between the positive input and the negative input, when the third and fourth switches are simultaneously closed.

6. The fully-differential preamplifier of claim 5, wherein the fully-differential preamplifier is configured for inclusion within a fully-differential receiver, and wherein the fifth and sixth switches when closed are configured to blank the fully-differential receiver.

7. The fully-differential preamplifier of claim 5, further comprising:
    a fifth capacitor coupled between the second terminal of the third capacitor and the negative input; and
    a sixth capacitor coupled between the second terminal of the fourth capacitor and the negative input;
    wherein the fifth and sixth capacitors comprise direct current (DC) blocking capacitors.

8. The fully-differential preamplifier of claim 1, wherein the current source is configured to change operation of the fully-differential preamplifier from a low current mode to a higher current mode in response to a mode control signal received from a controller.

9. The fully-differential preamplifier of claim 1, further comprising:
a pair of blanking switches that are configured to force a zero voltage differential between the positive and negative inputs, in response to the blanking switches being simultaneously closed.

10. The fully-differential preamplifier of claim 9, wherein a voltage differential between the positive and negative outputs is substantially zero while the pair of blanking switches are both closed.

11. A fully-differential preamplifier, comprising:
an input differential pair, an output current load, and a current source;
the current source coupled between the input differential pair and a low voltage rail and configured to control whether the fully-differential preamplifier is operating in a first mode or a second mode, wherein the fully-differential preamplifier draws more current when operating in the second mode compared to when operating in the first mode;
the input differential pair coupled between the output current load and the current source; and
the output current load coupled between a high voltage rail and the input differential pair;
wherein the input differential pair comprise positive and negative inputs of the fully-differential preamplifier;
wherein nodes where the input differential pair and the output current load are coupled to one another comprise positive and negative outputs of the fully-differential preamplifier;
wherein the input differential pair includes first and second N-channel metal-oxide-semiconductor field-effect transistors (MOSFETs), each of which includes a gate, a drain, and a source;
wherein the output current load includes first and second P-channel MOSFETs, each of which includes a gate, a drain, and a source;
wherein the sources of the first and second P-channel MOSFETs are connected to one another and to the high voltage rail;
wherein the drain of the first P-channel MOSFET is coupled to the drain of the first N-channel MOSFET and also comprises the negative output of the fully-differential preamplifier; and
wherein the drain of the second P-channel MOSFET is coupled to the drain of the second N-channel MOSFET and also comprises the positive output of the fully-differential preamplifier.

12. The fully-differential preamplifier of claim 11, wherein
the sources of first and second N-channel MOSFETs are connected to one another;
the gate of the first N-channel MOSFET comprising the positive input of the fully-differential preamplifier;
the gate of the second N-channel MOSFET comprising the negative input of the fully-differential preamplifier; and
the current source is connected between the connected together sources of the first and second N-channel MOSFETs and the low voltage rail.

13. The fully-differential preamplifier of claim 12, further comprising:

a first resistor and a first switch connected in parallel with one another between the gate and the drain of the first N-channel MOSFET; and
a second resistor and a second switch connected in parallel with one another between the gate and the drain of the second N-channel MOSFET;
a third resistor and a third switch connected in parallel with one another between the gate and the drain of the first P-channel MOSFET; and
a fourth resistor and a fourth switch connected in parallel with one another between the gate and the drain of the second P-channel MOSFET.

14. The fully-differential preamplifier of claim 13, wherein the first, second, third and fourth switches are configured to reset an operating voltage of the fully-differential preamplifier when the first, second, third, and fourth switches are simultaneously closed for a period of time.

15. A fully-differential preamplifier, comprising:
an input differential pair, an output current load, a current source, and a pair of blanking switches;
the current source coupled between the input differential pair and a low voltage rail and configured to control whether the fully-differential preamplifier is operating in a first mode or a second mode, wherein the fully-differential preamplifier draws more current when operating in the second mode compared to when operating in the first mode;
the input differential pair coupled between the output current load and the current source; and
the output current load coupled between a high voltage rail and the input differential pair;
wherein the input differential pair comprise positive and negative inputs of the fully-differential preamplifier;
wherein nodes where the input differential pair and the output current load are coupled to one another comprise positive and negative outputs of the fully-differential preamplifier; and
wherein the pair of blanking switches are configured to force a zero voltage differential between the positive and negative inputs of the fully-differential preamplifier, in response to the blanking switches being simultaneously closed.

16. The fully-differential preamplifier of claim 15, wherein fully-differential preamplifier is configured to output a substantially zero voltage differential between the positive and negative outputs while the pair of blanking switches are both closed.

17. A fully-differential preamplifier, comprising:
an input differential pair, an output current load, and a current source;
the current source coupled between the input differential pair and a low voltage rail and configured to control whether the fully-differential preamplifier is operating in a first mode or a second mode, wherein the fully-differential preamplifier draws more current when operating in the second mode compared to when operating in the first mode;
the input differential pair coupled between the output current load and the current source; and
the output current load coupled between a high voltage rail and the input differential pair;
wherein the input differential pair comprise positive and negative inputs of the fully-differential preamplifier;
wherein nodes where the input differential pair and the output current load are coupled to one another comprise positive and negative outputs of the fully-differential preamplifier;

wherein the output current load includes first and second P-channel MOSFETs, each of which includes a gate, a drain, and a source;

wherein the sources of the first and second P-channel MOSFETs of the output current load are connected to one another and to the high voltage rail; and wherein the output current load further comprises a first capacitor coupled between the gate and the source of the first P-channel MOSFET, and a second capacitor coupled between the gate and the source of the second P-channel MOSFET.

18. The fully-differential preamplifier of claim 17, wherein the first and second capacitors are configured to maintain voltages at the gates of the first and second P-channel MOSFETs so that the first and second P-channel MOSFETs act as current sources and increase an impedance of the fully-differential preamplifier, compared to if the first and second capacitors were not present.

19. A fully-differential preamplifier, comprising:

an input differential pair, an output current load, and a current source;

the current source coupled between the input differential pair and a low voltage rail and configured to control whether the fully-differential preamplifier is operating in a first mode or a second mode, wherein the fully-differential preamplifier draws more current when operating in the second mode compared to when operating in the first mode;

the input differential pair coupled between the output current load and the current source, wherein the input differential pair comprise positive and negative inputs of the fully-differential preamplifier;

the output current load coupled between a high voltage rail and the input differential pair, wherein nodes where the input differential pair and the output current load are coupled to one another comprise positive and negative outputs of the fully-differential preamplifier;

a first high pass filter and a first direct current (DC) blocking capacitor coupled between positive input and a first electrode; and a second high pass filter and a second DC blocking capacitor coupled between the negative input and a second electrode.

20. The fully-differential preamplifier of claim 19, further comprising:

a pair of blanking switches that are configured to force a zero voltage differential between the positive and negative inputs, in response to the blanking switches being simultaneously closed.

* * * * *